(12) United States Patent
Derderian et al.

(10) Patent No.: US 8,253,171 B1
(45) Date of Patent: Aug. 28, 2012

(54) TWO TERMINAL NANOTUBE SWITCH, MEMORY ARRAY INCORPORATING THE SAME AND METHOD OF MAKING

(75) Inventors: Garo J. Derderian, Manassas, VA (US); Michael J. O'Connor, Manassas Park, VA (US); Adrian N. Robinson, Haymarket, VA (US); Jonathan W. Ward, Fairfax, VA (US)

(73) Assignee: Lockheed Martin Corporation, Bethesda, MD (US)

( * ) Notice: Subject to any disclaimer, the term of this patent is extended or adjusted under 35 U.S.C. 154(b) by 138 days.

(21) Appl. No.: 12/857,494

(22) Filed: Aug. 16, 2010

Related U.S. Application Data

(60) Provisional application No. 61/237,636, filed on Aug. 27, 2009.

(51) Int. Cl.
*H01L 27/118* (2006.01)
(52) U.S. Cl. .................. 257/204; 257/E27.007
(58) Field of Classification Search ......... 257/204–209, 257/210, 212, 130, E27.007; 361/148, 150; 438/128, 129
See application file for complete search history.

(56) References Cited

U.S. PATENT DOCUMENTS

| | | | |
|---|---|---|---|
| 4,979,149 A | 12/1990 | Popovic et al. | |
| 6,574,130 B2 | 6/2003 | Segal et al. | |
| 6,580,184 B2 * | 6/2003 | Song | 307/112 |
| 6,643,165 B2 | 11/2003 | Segal et al. | |
| 6,706,402 B2 | 3/2004 | Rueckes et al. | |
| 6,784,028 B2 | 8/2004 | Rueckes et al. | |
| 6,835,591 B2 | 12/2004 | Rueckes et al. | |
| 6,911,682 B2 | 6/2005 | Rueckes et al. | |
| 6,919,592 B2 | 7/2005 | Segal et al. | |
| 6,924,538 B2 | 8/2005 | Jaiprakash et al. | |
| 7,071,023 B2 | 7/2006 | Bertin et al. | |
| 7,335,395 B2 | 2/2008 | Ward et al. | |
| 7,365,632 B2 | 4/2008 | Bertin et al. | |
| 7,394,687 B2 | 7/2008 | Bertin et al. | |
| 7,479,654 B2 | 1/2009 | Bertin et al. | |
| 7,541,216 B2 | 6/2009 | Yates et al. | |
| 7,560,136 B2 | 7/2009 | Ward et al. | |
| 7,566,478 B2 | 7/2009 | Ward et al. | |
| 7,884,349 B2 * | 2/2011 | Rinerson et al. | 257/5 |
| 2004/0181630 A1 | 9/2004 | Jaiprakash et al. | |
| 2005/0035367 A1 | 2/2005 | Bertin et al. | |
| 2005/0036365 A1 | 2/2005 | Bertin et al. | |
| 2005/0062035 A1 | 3/2005 | Bertin et al. | |
| 2006/0276056 A1 | 12/2006 | Ward et al. | |
| 2008/0012047 A1 | 1/2008 | Bertin et al. | |
| 2008/0079027 A1 * | 4/2008 | Bertin et al. | 257/209 |

(Continued)

*Primary Examiner* — Nathan Ha
(74) *Attorney, Agent, or Firm* — McDermott Will & Emery LLP

(57) ABSTRACT

A two terminal switching device includes a first conductive terminal, a second conductive terminal in spaced relation to the first terminal, the first terminal encompassed by the second terminal. The device also includes an electrically insulating spacer that encompasses the first terminal and provides the spaced relation between the second terminal and the first terminal. It also includes a nanotube article comprising at least one carbon nanotube, the nanotube article being arranged to overlap at least a portion of each of the first and second terminals. The device also includes a stimulus circuit in electrical communication with at least one of the first and second terminals that is capable of applying a first electrical stimulus to at least one of the first and second terminals to change the resistance of the device between the first and second terminals from a relatively low resistance to a relatively high resistance.

73 Claims, 5 Drawing Sheets

U.S. PATENT DOCUMENTS

| | | |
|---|---|---|
| 2008/0158936 A1 | 7/2008 | Bertin et al. |
| 2008/0160734 A1* | 7/2008 | Bertin et al. ............... 438/582 |
| 2008/0212361 A1 | 9/2008 | Bertin et al. |
| 2008/0231413 A1 | 9/2008 | Bertin et al. |
| 2009/0016094 A1* | 1/2009 | Rinerson et al. ............ 365/148 |
| 2009/0154218 A1 | 6/2009 | Bertin et al. |
| 2009/0184389 A1* | 7/2009 | Bertin et al. ............... 257/476 |
| 2009/0243102 A1 | 10/2009 | Yates et al. |
| 2010/0001267 A1 | 1/2010 | Manning et al. |

* cited by examiner

TWO TERMINAL NANOTUBE SWITCH, MEMORY ARRAY INCORPORATING THE SAME AND METHOD OF MAKING

CROSS-REFERENCES TO RELATED APPLICATIONS

This patent application claims priority to U.S. Provisional Patent Application Ser. No. 61/237,636 filed Aug. 27, 2009 which is incorporated herein by reference in its entirety.

STATEMENT REGARDING FEDERALLY SPONSORED RESEARCH OR DEVELOPMENT

This invention was made with U.S. Government support under Contract No. NRO000-08-C-0294 awarded by the National Reconnaissance Office. The U.S. Government has certain rights in the invention.

BACKGROUND OF THE INVENTION

Digital logic circuits are increasingly used in all manner of consumer, governmental, industrial and other applications. Examples include personal computers, portable electronic devices such as personal organizers and calculators, electronic entertainment devices, and in control circuits for appliances, telephone switching systems, automobiles, aircraft, industrial control systems and other items of manufacture. Early digital logic was constructed out of discrete switching elements composed of individual bipolar transistors. With the invention of the bipolar integrated circuit, large numbers of individual switching elements could be combined on a single silicon substrate to create complete digital logic circuits such as inverters, NAND gates, NOR gates, flip-flops, adders, etc. However, the density of bipolar digital integrated circuits is limited by their high power consumption and the ability of packaging technology to dissipate the heat produced while the circuits are operating. The availability of metal oxide semiconductor ("MOS") integrated circuits using field effect transistor ("FET") switching elements significantly reduces the power consumption of digital logic and enables the construction of the high density, complex digital circuits used in current technology. The density and operating speed of MOS digital circuits are still limited by the need to dissipate the heat produced when the device is operating, and other factors, such as material costs, device yields and the like.

Digital logic integrated circuits constructed from bipolar or MOS devices do not function correctly under conditions of high heat or extreme environment. Many current digital integrated circuits are normally designed to operate at temperatures less than 100° C., while some that have been hardened for harsh environments are designed to operate at temperatures over 200° C. In conventional integrated circuits, the leakage current of the individual switching elements in the "off" state increases rapidly with temperature. As leakage current increases, the operating temperature of the device rises, the power consumed by the circuit increases, and the difficulty of discriminating the off state from the on state reduces circuit reliability. Conventional digital logic circuits may also short internally when subjected to extreme environments because they may generate electrical currents inside the semiconductor material. It is possible to manufacture integrated circuits with special devices and isolation techniques so that they remain operational when exposed to extreme environments, but the high cost of these devices limits their availability and practicality. In addition, such digital circuits exhibit timing differences from their normal counterparts, requiring additional design verification to add protection to an existing design.

Integrated circuits constructed from either bipolar or FET switching elements are volatile. They only maintain their internal logical state while power is applied to the device. When power is removed, the internal state is lost unless some type of non-volatile memory circuit, such as EEPROM (electrically erasable programmable read-only memory), is added internal or external to the device to maintain the logical state. Even if non-volatile memory is utilized to maintain the logical state, additional circuitry is necessary to transfer the digital logic state to the memory before power is lost, and to restore the state of the individual logic circuits when power is restored to the device. Alternative solutions to avoid losing information in volatile digital circuits, such as battery backup, also add cost and complexity to digital designs.

Important characteristics for logic circuits in an electronic device are low cost, high density, low power, and high speed. Conventional logic solutions are limited to silicon substrates, but logic circuits built on other substrates would allow logic devices to be integrated directly into many manufactured products in a single step, further reducing cost.

Various devices have been proposed that incorporate nanotubes to form non-volatile memory. For example, as disclosed in U.S. Pat. No. 6,919,592, a nanofabric may be patterned into ribbons, and the ribbons can be used as a component to create non-volatile electromechanical memory cells. The ribbon is electromechanically-deflectable in response to electrical stimulus of control traces and/or the ribbon. The deflected, physical state of the ribbon may be made to represent a corresponding information state. The deflected, physical state has non-volatile properties, meaning the ribbon retains its physical (and therefore informational) state even if power to the memory cell is removed. As disclosed in U.S. Pat. No. 6,911,682, entitled "Electromechanical Three-Trace Junction Devices," three-trace architectures may be used for electromechanical memory cells, in which the two of the traces are electrodes to control the deflection of the ribbon.

The use of an electromechanical bi-stable device for digital information storage has also been suggested (See U.S. Pat. No. 4,979,149, entitled "Non-volatile Memory Device Including a Micro-Mechanical Storage Element").

The creation and operation of bi-stable, nano-electro-mechanical switches based on carbon nanotubes (including mono-layers constructed thereof) and two metal terminals has been detailed in earlier patent applications having a common assignee as the present application, including U.S. Pat. Nos. 6,784,028; 6,835,591; 6,574,130; 6,643,165; 6,706,402; 6,919,592; 6,911,682; 6,924,538; 7,479,654 and 7,541,216; U.S. Patent Publication Nos. 2005-0062035, 2005-0035367, 2005-0036365, 2004-0181630; 2008-0012047; 2008-0158936; 2009-0243102 and 2010-0001267; and U.S. patent application Ser. Nos. 10/341,005; 10/341,055; 10/341,054; 10/341,130; 11/280,599 and 11/274,967; the contents of which are hereby incorporated by reference in their entireties (hereinafter and hereinbefore the "incorporated patent references").

One application of bi-stable, two terminal nanotube switches is in non-volatile carbon nanotube (CNT) memory or nano random access memory (NRAM). An "ON or "1" state may be set with a current limited voltage pulse to set the switch as a memory bit to a low resistive state and an "OFF" or "0" state may be set with a non-current limited voltage pulse to set the switch to a high resistive state. One problem observed in the use of these switches as NRAM is that a first pulse used to turn an entire array of bits "OFF" may result in a significant number of bits turning "ON" to a very low resistive state. Due to the low currents that are available when using complementary metal-oxide-semiconductor (CMOS) chips, this can result in a situation where it is not possible to switch the switches "OFF" again, with the result that the switches are considered stuck. Since it is generally necessary to assure the workings and capacity of the memory, stuck switches represent defects in the NRAM memory, resulting in undesirably low memory device yields.

Accordingly, it is desirable to provide improved NRAM memory arrays that utilize two terminal carbon nanotube switches, particularly those having improved memory yields, as well as methods for making improved NRAM memory arrays.

SUMMARY OF THE INVENTION

In an exemplary embodiment, a two terminal switching device is disclosed. The device includes a first conductive terminal, a second conductive terminal in spaced relation to the first terminal, the first terminal encompassed by the second terminal. The device also includes an electrically insulating spacer, the spacer encompassing the first terminal and providing the spaced relation between the second terminal and the first terminal. The device further includes a nanotube article comprising at least one carbon nanotube, the nanotube article being arranged to overlap at least a portion of each of the first and second terminals. Still further, the device includes a stimulus circuit capable of applying a first electrical stimulus to at least one of the first and second terminals to change the resistance of the device as formed between the first and second terminals from a relatively lower first resistance to a relatively higher second resistance. The stimulus circuit also capable of applying a second electrical stimulus to at least one of the first and second terminals to change the resistance of the device as formed between the first and second terminals from the relatively higher second resistance to the relatively lower first resistance, wherein the relatively higher second resistance between the first and second terminals corresponds to an "OFF" state of the device, and wherein the relatively lower first resistance between the first and second terminals corresponds to an "ON" state of the device, and wherein the plurality of devices as formed have an initial "ON" state yield and an initial "OFF" state yield.

In another exemplary embodiment, a memory array is disclosed. The array includes a plurality of two-terminal switching devices disposed on a substrate. Each device includes: a first conductive terminal; a second conductive terminal in spaced relation to the first terminal; the first terminal encompassed by the second terminal; an electrically insulating spacer, the spacer encompassing the first terminal and providing the spaced relation between the second terminal and the first terminal; and a nanotube article comprising at least one carbon nanotube, the nanotube article being arranged to overlap at least a portion of each of the first and second terminals. The array also includes a stimulus circuit in electrical communication with each of the at least one of the first and second terminals, the stimulus circuit capable of applying a first electrical stimulus to each of the at least one of the first and second terminals to change resistance of the device between the first and second terminals from a relatively lower first resistance to a relatively higher second resistance. The stimulus circuit also capable of applying a second electrical stimulus to each of the at least one of the first and second terminals to change the resistance of the device as formed between the first and second terminals from the relatively higher second resistance to the relatively lower first resistance, wherein the relatively higher second resistance between the first and second terminals corresponds to an "OFF" state of each of the devices, and wherein the relatively lower first resistance between the first and second terminals corresponds to an "ON" state of each of the devices, and wherein the plurality of devices as formed have an initial "ON" state yield and an initial "OFF" state yield.

In yet another exemplary embodiment, a method of making a memory array is disclosed. The method includes forming a plurality of two-terminal switching devices disposed on a substrate. Each device includes a first conductive terminal; a second conductive terminal in spaced relation to the first terminal; and a nanotube article comprising at least one carbon nanotube, the nanotube article being arranged to overlap at least a portion of each of the first and second terminals. Each device also includes a stimulus circuit in electrical communication with each of the at least one of the first and second terminals, the stimulus circuit capable of applying a first electrical stimulus to each of the at least one of the first and second terminals to change a resistance of the device as formed between the first and second terminals from a relatively lower first resistance to a relatively higher second resistance. The stimulus circuit also capable of applying a second electrical stimulus to each of the at least one of the first and second terminals to change the resistance of the device as formed between the first and second terminals from the relatively higher second resistance to the relatively lower first resistance, wherein the relatively higher second resistance between the first and second terminals corresponds to an "OFF" state of each of the devices, and wherein the relatively lower first resistance between the first and second terminals corresponds to an "ON" state of each of the devices, and wherein the plurality of devices as formed have an initial "ON" state yield and an initial "OFF" state yield.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the detailed description is to be regarded as illustrative in nature and not as restrictive.

These and other advantages and features will become more apparent from the following description taken in conjunction with the drawings.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Two-terminal carbon nanotube (CNT) switches (2-TNS) 10, a memory array device 100 using those switches, and a method 200 of making the switches and array device are disclosed. The switches 10 and method 200 are particularly suited to making memory array devices 100 having improved bit yields, particularly a reduced number of bits that are stuck in the "ON" state, and more particularly those that are stuck in "ON" state in response to a first voltage pulse intended to set the device switches to an "OFF" state.

According to various aspects of the disclosure, in order to improve bit yield, the resistance of 2-TNS 10 may be raised so that they may turn off before they become too conductive. In some aspects, resistance of 2-TNS 10 may be raised without etching the CNTs. The resistance of the CNTs can be increased by exposing the CNTs to various reactive materials, particularly various reactive gases. In one example, exposure to xenon difluoride ($XeF_2$) gas, such as by exposure to a plurality of pulses of increased pressure of this gas, may be used to increase resistance of the CNTs. In one example, a wafer with an "ON" bit yield of about 98% and an "OFF" bit yield of about 67% (due to a balance of stuck "ON" bits) may be treated with five pulses of $XeF_2$. In such a case, the "ON" bit yield may remain at about 98% while the "OFF" yield may increase to about 98%. This increase in the "OFF" bit yield may be due to increased resistance (either through damage to the CNTs, fluorination or both). The higher resistance may allow the bits to have more time to turn off before they change to a low resistance state, or the higher resistance may allow the bits to heat up faster so that they may break. In some aspects, the bits may be easier to break due to either defects caused by exposure to the gas or changes in bonding as a result of the creation of the fluoride-carbon (F—C) bonds. In some aspects, most CNTs may break to allow the switch to operate correctly.

Figure 1:
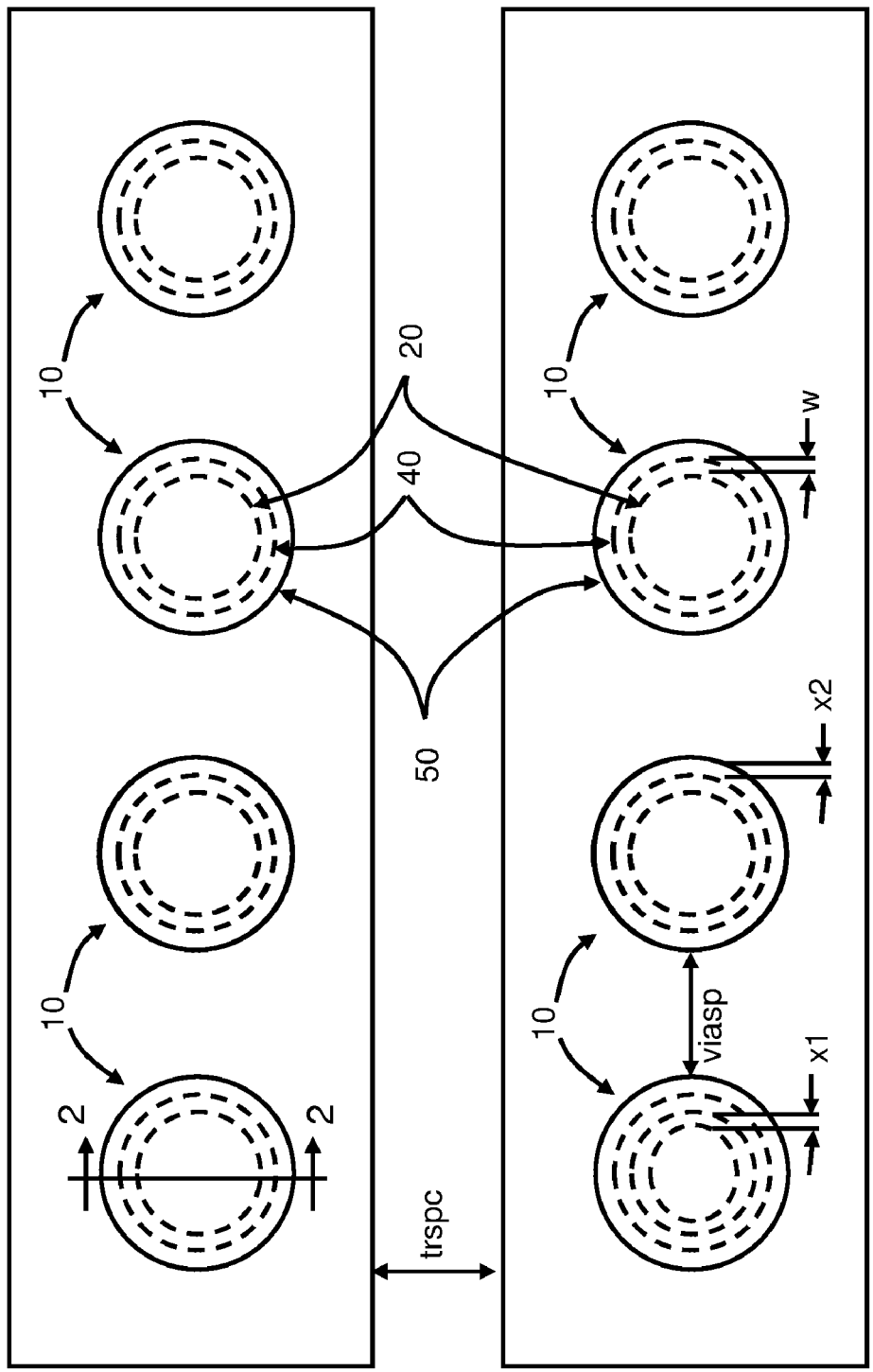
FIG. 1 is a top view of an array of two-terminal nanotube switches as disclosed herein.

In general, referring to FIG. 1, a first electrically conductive terminal 20 is encompassed in spaced relation within a second electrically conductive terminal 30 and separated by an electrically insulating spacer 40. A nanotube element 50 or article overlaps at least a portion of each of the first terminal 20 and second terminal 30. An electrical stimulus circuit 1, connected to and in electrical signal communication with one or both of the first and second terminals 20, 30, applies appropriate electrical stimulus to which the nanotube article 50 responds by changing the state of the switch. For example, the resistance of an electrical pathway between the two terminals characterizes the state of the switch. In an exemplary embodiment, a relatively high resistance pathway corresponds to an "open" or OFF state of the switch, and a relatively low resistance pathway corresponds to a "closed" or ON state of the switch. The two states of the switch are non-volatile, in that they do not require on-going electrical stimulus to maintain the states of the switch once a given switch state has been obtained. The stimulus circuit can non-destructively read-out (NDRO) the state of the switch, and can change the state (e.g., resistance) of the switch repeatedly.

The ability to change the switch between the two states may be related to a relationship between the thermal and electrical characteristics of the switch. More particularly, the performance of the switch may be related to a relationship between the electrical current that passes through the nanotube element and the dissipation of heat out of the nanotube element. Desirably, in order to change the switch to the "open" state, the stimulus circuit may apply a stimulation that is large enough to cause overheating in the nanotube element, and at the same time the switch may have design characteristics that limit the amount of current-induced heat that can flow out of the nanotube element. This may allow the overheating of the nanotube element, which breaks conductive paths in the switch and creates the "open" state. In other words, the thermal and electrical management of the switch may be used to enhance the buildup of heat in the nanotube element, so that an "open" state can be formed. In some embodiments, thermal and electrical management is accomplished by overlapping the nanotube article with at least one of two terminals, e.g., conductive elements, in a predetermined, controlled way. For example, in some embodiments, the nanotube element overlaps at least one of the two terminals with a specified geometry, e.g., a controlled overlap length of a preferred length. Then heat flows poorly from the nanotube element into the terminal, but the length of contact is long enough that current flows well from the terminal into the nanotube element. In some embodiments, thermal and electrical management is accomplished by fabricating the switch from selected materials that dissipate heat particularly poorly. For example, the switch can be passivated with a layer that has a low thermal conductivity, which helps to trap heat in the nanotube element. Or, the terminals can be fabricated from a material that has a relatively good electrical conductivity and a relatively poor thermal conductivity. Other designs and materials for thermal and electrical management of the switch are contemplated. It should be noted that while changes in the resistance of the switch due to electrical stimulation have been repeatedly observed, that the causes of these resistance changes are still being considered from both a theoretical and experimental standpoint. The thermal effects as described herein may cause or contribute to the observed behavior. Other effects may also cause or contribute to the observed behavior.

The switch described herein can be fabricated using methods that are easily integrated into existing semiconductor fabrication methods, as described herein. Several methods that allow the fabrication of an overlap of specified geometry between the nanotube article or element and a terminal are also described herein.

Because the switch can be controllably switched between two non-volatile states, and because the fabrication of the switch can be integrated into existing semiconductor fabrication methods, the switch is useful in a number of applications. For example, the switch can be implemented in non-volatile random access memory (NRAM) arrays, reprogrammable fuse/antifuse devices, reprogrammable wiring and other switching applications.

First, embodiments of two-terminal nanotube-based nonvolatile switches are shown, and their various components are described. Secondly, an embodiment of a memory array device that utilizes the two-terminal nanotube-based switches is described. Finally, a method of making two-terminal nanotube-based nonvolatile switches with an improved bit (switch) yield is described, particularly a method of making a memory array that includes these switches that has an improved bit yield.

The two-terminal nanotube-based nonvolatile switches are advantageous in that they may be placed in closer proximity to one another than in may prior art designs. They also advantageously avoid corners, particularly sharp corners, in the switching region of the device, which reduces the electric fields and possibility of current concentration in these areas during operation of the devices and reduces the propensity for breakdown of the materials of the switch or the surrounding insulting materials due to concentration of electric fields, as well as thermal effects associated with current concentration and switching of the devices. The advantages of the switches disclosed herein also advantageously improve the memory density and initial yield of memory arrays that incorporate them. They also may be advantageously treated as described herein to further improve the initial yield.

2-Terminal Nanotube Switches

FIG. 1 illustrates a partial cross-sectional, schematic representation of nonvolatile 2-terminal nanotube switch (2-TNS) 10, including stimulus circuit 1. 2-TNS 10 and stimulus circuit 1, or a plurality of them, may comprise, for example, a switching device 100, such as various CMOS memory array devices 102, fuse/antifuse devices 104, and reprogrammable wiring devices 106.

Referring again to FIG. 1, in an exemplary embodiment, 2-TNS 10 is disposed on a substrate 60. Substrate 60 may be any suitable substrate 60 for one or more 2-TNS 10 switches. In an exemplary embodiment, substrate 60 comprises a CMOS memory array 102. CMOS memory array 102 includes a plurality of electrically conductive substrate terminals 62, such as conductive vias, to provide electrical communication with at least one of the gate source and drain portions of an array of transistors 64. Substrate terminals 62 may include any suitable conductor, including various metallization layers, or combinations of metallization layers. In one exemplary embodiment, substrate terminals 62 may include a multilayer terminal metallization 66 of an outer layer of TiN 68 as a protective layer, a middle layer of Al 70 to provide robust electrical conductivity, and an underlayer 72 of TiN to promote adhesion to the appropriate portion of the transistor.

An electrically insulating layer 74 is disposed on substrate 60. Layer 74 may be formed of any suitable electrically insulating material 76 that is compatible with substrate 60 and processing associated therewith and the deposition or disposition of other materials that make up 2-TNS 10. In an exemplary embodiment, insulating material may include $SiO_2$. Insulating layer 72 may have any suitable thickness needed to provide the desired electrical insulation and isolation characteristics, including, in an exemplary embodiment, a thickness of about 50 nm. Insulating layer 72 may extend, for example, over the entirety of substrate 60, such as CMOS memory array 102, or over predetermined portions thereof. Insulating material 76 may include any suitable electrical insulator that is capable of provide the desired electrical isolation of the elements of 2-TNS 10. In an exemplary embodiment, insulating material may include $SiO_2$.

First terminal 20 of 2-TNS 10 comprises an electrically conductive via 22 that is disposed on and in electrical signal communication with electrically substrate terminal 62. Via 22 extends through the insulating layer 74 to a top surface 78 thereof. Via 22 may include any suitable first electrically conductive material, such as, for example, via metallization 24. In an exemplary embodiment, via metallization 24 may include tungsten, and more particularly an underlayer 25 of Ti to promote adhesion to terminal 62, a middle layer 26 of TiN to provide electrical contact and promote adhesion to an outer layer 27 of tungsten. The outer layer 27 of tungsten provides a highly conductive path and metallization to provide an electrical contact to nanotube article 50. In an exemplary embodiment, the outer surface 28 of via 22 is substantially coplanar with the top surface 76 of insulating layer 74. Via 22 may have any suitable cross-sectional shape that is compatible with the design of 2-TNS 10, including a cylindrical shape as shown generally in FIG. 2. However, other cross-sectional shapes, including square, rounded square, rectangular shapes, rounded rectangular and other regular or irregular polygonal shapes are also possible. First terminal 20 may have any suitable size, including any suitable width and depth. In an exemplary embodiment, first terminal 20 may have a diameter of at least about 0.26 to about 0.36 µm. First terminal 20 and via 22 may have a depth of about 700 to about 1000 nm.

Second terminal 30 of 2-TNS 10 is electrically conductive and comprises an electrically conductive trench 32. Trench 32 may include a patterned conductive material, such as metallization layer 33 or pathway that extends across substrate 60, such as a bit line of memory array 102, and may comprise the second terminal 30 for a plurality of 2-TNS 10 switches. Metallization layer 33 may include a multilayer metallization layer, such as a Ti/TiN/W metallization layer. Second terminal 30 and trench 32 are embedded in insulating layer 74 and encompass or completely surround first electrically conductive terminal 20. Second terminal 30 has a top surface 34 that is substantially coplanar with the top surface 76 of insulating layer 74 and the outer surface 28 of via 22 and first terminal 20. Second terminal 32 has an opening 36 that encompasses first terminal 20 and an electrically insulating spacer 40. Trench 32 may have any suitable depth or thickness and width, including, in an exemplary embodiment, a thickness of about 400 to about 500 nm and a width of at least about 0.66 µm. Second terminal 30 may be formed from any suitable electrically conductive trench material 33. In an exemplary embodiment, second terminal 30 includes tungsten as a trench material 33. As sown in FIG. 2, first terminals 20 may be spaced from one another along second terminal 30 by any suitable via spacing (viasp) distance. In an exemplary embodiment, the spacing is at least about 0.26 µm to about 1.48 µm. Each second terminal 30 may include any suitable number of first terminals 20, and first terminals may comprise an array of first terminals 20. Second terminals 30 may include an array of second terminals 30 spaced from one another. The array may include any suitable number of second terminals 30 depending on the desired number of 2-TNS 10 switches. In an exemplary embodiment, the spacing between adjacent second terminals (trspc) may include at least about 0.66 µm to about 2.34 µm.

2-TNS 10 also includes an electrically insulating spacer 40 located between first terminal 20 and second terminal 30 that provides electrical isolation between them. Insulating spacer 40 encompasses or completely surrounds first terminal 20 and extends along the thickness of trench 32. Spacer 40 may be formed from insulating layer 74, or may include a separate layer of spacer insulating material 42. The spacer insulating material 42 may include the same material as insulating material 76, or a different material. In an exemplary embodiment, spacer insulating material includes $SiO_2$. Insulating spacer 40 also has an upper surface 44 that is also coplanar with top surface 34 of second terminal 30, top surface 76 of insulating layer 74 and the outer surface 28 of via 22.

Figure 2:
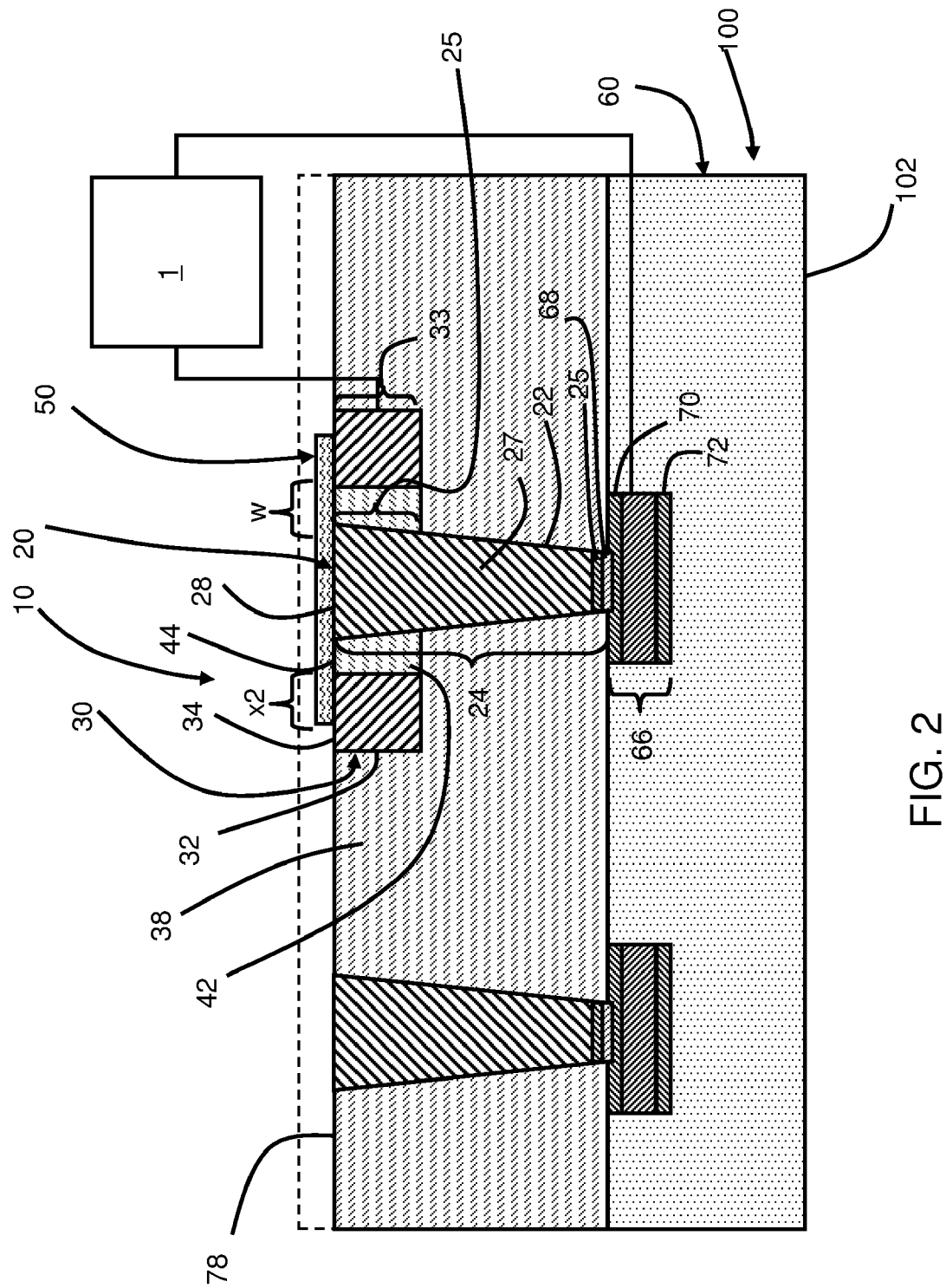
FIG. 2 is a schematic cross-sectional illustration of a two-terminal nanotube switch as disclosed herein.

2-TNS 10 also includes nanotube article 50. Nanotube article 50 includes at least one carbon nanotube (not shown), but will preferably comprise a plurality of carbon nanotubes. Carbon nanotubes may include single-wall or multi-wall nanotubes, or a combination thereof. In an exemplary embodiment, nanotube article 50 includes a carbon nanotube fabric 52 that includes a plurality of carbon nanotubes. Nanotube article 50 is disposed between first terminal 20 and second terminal 30 over spacer 40 on the upper or outer coplanar surfaces of these elements. Nanotube article 50 may have any suitable cross-sectional shape or size that is compatible with the design of 2-TNS 10, including a cylindrical or circular shape as shown generally in FIG. 2. However, other cross-sectional shapes, including square, rounded square, rectangular shapes, rounded rectangular and other regular or irregular polygonal shapes are also possible. In an exemplary embodiment, nanotube article has a circular shape and may have a diameter of at least about 200 to about 400 nm. Nanotube article 50 may have any suitable layer thickness. In an exemplary embodiment, the nanotube article may have a thickness of at least about 350 to about 1000 nm. Nanotube article 50 may be disposed to cover the entirety of first terminal 20 and to provide a predetermined overlap (x2) of second terminal 30 as shown in FIG. 2. Alternately, Nanotube article 50 may be disposed to provide a predetermined overlap of first terminal 20 (x1) and to provide a predetermined overlap of second terminal 30 (x2), such that nanotube article has a cross-sectional shape of a ring or donut, as shown in FIG. 2. The predetermined overlap (either x1 or x2) may be any suitable overlap distance. In an exemplary embodiment, the overlap distance may be about 1 to about 150 nm. The switching of the nanotube article 50 occurs in the switching region 54 which lies between first terminal 20 and the second terminal 30. The switching region has a width that is defined by the size of the opening 36 of second terminal 30 and the size of first terminal 20. In an exemplary embodiment, the width (w) is uniform around the periphery of first terminal 20 and the periphery of opening 36 comprising a ring shape, and may be measured along a radial line extending from a center of first terminal 20. In an exemplary embodiment, the width of switching region may be about 1 to about 200 nm. Adjacent 2-TNS 10 switches may have nanotube articles 50 spaced by any suitable distance that is compatible with the spacing of first terminals 20 and openings 36. In an exemplary embodiment, the spacing may be at least about 0.26 µm to about 1.54 µm.

Figure 4:
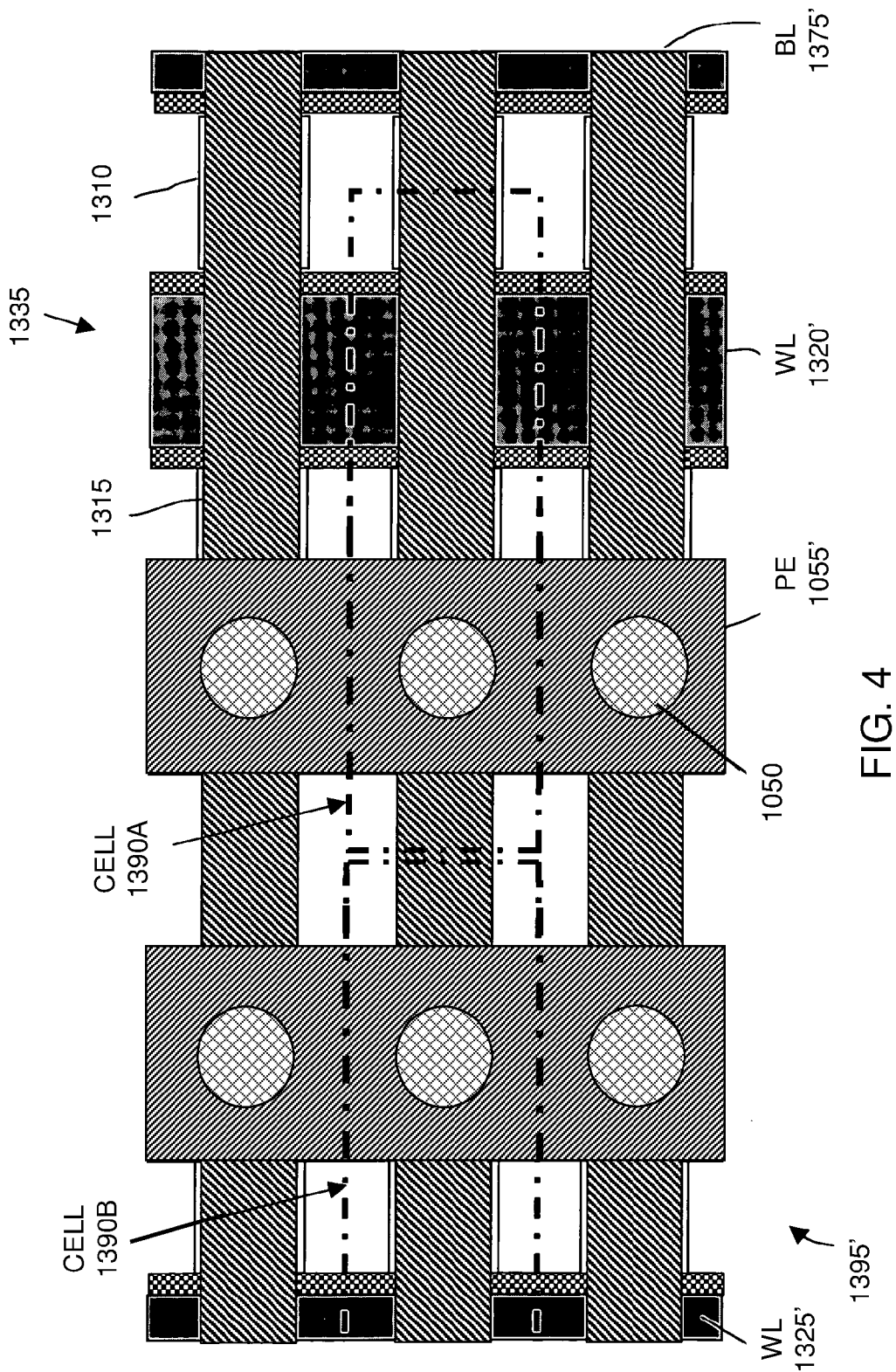
FIG. 4 is a schematic top plan view of the memory array of FIG. 3.
Figure 5:
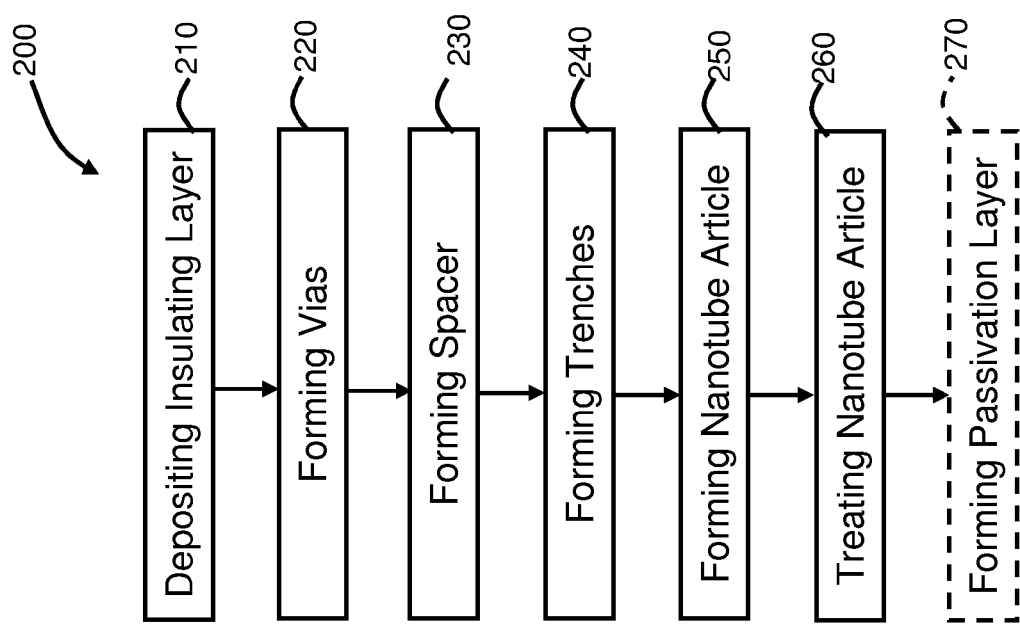
FIG. 5 is a flow chart of a method of making a memory array as disclosed herein.

Referring to FIG. 4, a method 200 of making 2-TNS 10, and more particularly an array of 2-TNS 10 switches, includes depositing 210 insulating layer 74 on substrate 60. Method 200 also includes forming 212 a via hole 23, and more particularly, may include forming a plurality of via holes 23 in insulating layer 74. Via hole 23 may be formed, for example, by any suitable process, including photolithographic patterning to define the hole locations followed by etching to define via holes 23. Via hole 23 extends through to terminal 66 and may, for example extend through TiN layer 68 to Al layer 70 to provide lower contact resistance between via 22 and terminal 66.

Method 200 also includes forming 220 via 22, and more particularly, may include forming an array of vias 22. In an exemplary embodiment, forming via 22 may include deposition of a via metallization 24, such as a multilayer Ti/TiN/W metallization layer 24 sufficient to fill via holes 23 to the thickness of insulating layer 74, followed by a planarization process, such as chemical mechanical planarization (CMP), to remove the metallization layer 24 everywhere except within the via holes 23, thereby defining via 22 within via hole 23.

Method 200 also includes forming 230 spacer 40 that encompasses via 22. Forming 230 may include forming 232 trench hole 38 in insulating layer 74. More particularly, trench hole 38 may extend along a plurality of vias 22. Forming 232 of trench hole 232 exposes a portion of the sidewall 25 of one or more vias 22 and defines the size of trench 32. Forming 230 of spacer 40 also includes depositing 234 a layer of spacer insulating material 42 into trench hole 38 to define spacer 40. More particularly, depositing 234 may include depositing a layer of spacer insulating material 42 over the entire surface of substrate 60 sufficient to define spacer 40, or a plurality spacers 40.

Method 200 also includes forming 240 trenches 32. Forming 240 may include depositing 242 a metallization layer 33 of trench material sufficient to fill trench 32, or an array of trenches 32 to the desired trench thickness. Forming 240 trench 32 may, for example, include depositing 242 a metallization layer 33 of trench material 242 over the entirety of substrate 60. Forming 240 may also include planarizing 244 the surface of substrate 60 to remove trench material 242 and spacer insulating material 42 in order to provide a coplanar surface 56 that includes the outer surface 28 of first terminal 20, the top surface 34 of second terminal 30 and upper surface 44 of spacer 40.

Method 200 also includes forming 250 the carbon nanotube article 50 on the coplanar surface 56. Forming 250 may include depositing 252 a layer of a nanotube fabric 52 over the entire surface of substrate 60, followed by removing the nanotube fabric 52 to define nanotube article 50. Removing may include, for example, using photolithography to define the area of the nanotube article 50 using a photoresist, followed by etching to remove the nanotube fabric 52 in areas other than those associated with nanotube articles 50 using patterning methods as described herein.

Method 200 may also optionally include disposing 260 a passivation layer 90 of passivation materials 92 over nanotube articles 50 following treatment of the nanotube articles 50 as described herein. Disposing 260 may also include disposing the passivation layer 90 over the other elements of 2-TNS 10, including first terminal 20 and second terminal 30, and more particularly, may include disposing passivation layer over the entirety of the surface of substrate 60.

2-TNS 10 switch may be incorporated into an array 10 of 2-TNS 10 switches in a switching device 100, and more particularly, may be incorporated into a memory array device 102. These switches are particularly useful for incorporation into a CMOS memory array device as shown in FIGS. 3 and 4.

Figure 3:
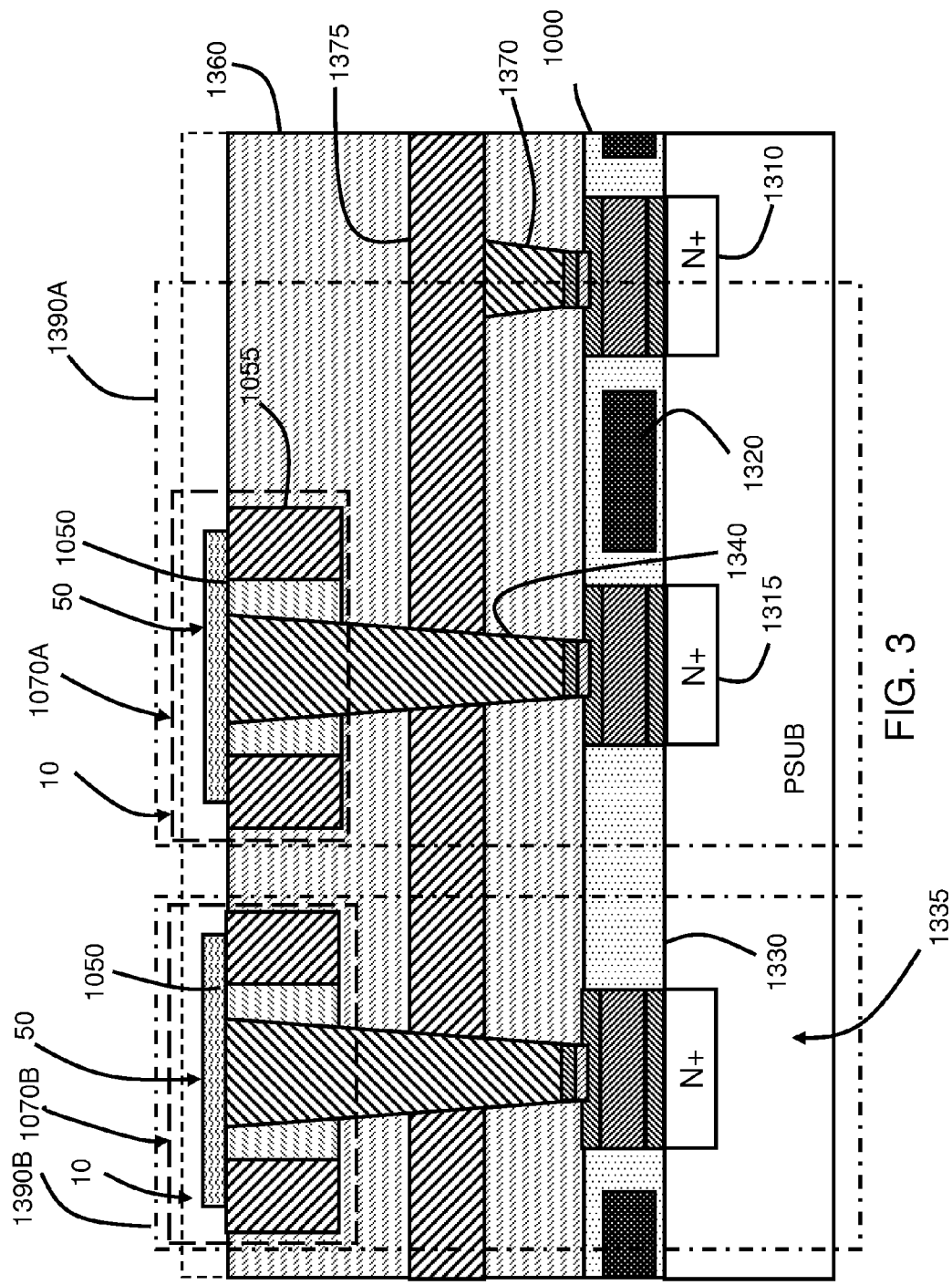
FIG. 3 is a schematic cross-sectional illustration of a plurality of two-terminal nanotube switches in an exemplary embodiment of a memory array as disclosed herein.

Conventional semiconductor materials and processes may be used to form a precursor CMOS memory array device 102, including preferred methods to deposit and pattern a conducting layer forming conducting stud 1370 and bit line 1375 as shown in cross section 1395 of FIG. 3 and bit line 1375' as shown in corresponding plan view 1395' in FIG. 4. A conducting path is formed between bit line 1375 (1375') and drain 1310 through studs 1370 and 1345. If transistor 1335 is in the "OFF" state, then channel region 1330 is not formed, and bit line 1375 (1375') is electrically isolated from nanotube element 1025. If, however, transistor 1335 is in the "ON" state, then a conductive channel is formed, which connects drain 1310 and source 1315. This forms a conductive path between bit line 1375 (1375') and nanotube article 50 through studs 1370 and 1345, drain 1310, channel 1330, source 1315, stud 1340, and conductive element 1005.

FIGS. 3 and 4 illustrate different views of transistor 1335, which is used to select (or not select) cell 1390A using gate 1320, which is also part of word line 1320'. Other cells such as cell 1390B may be selected instead by activating other word lines, such as 1325'. Conductive element 1055' overlaps nanotube element 1025 in cell 1390A by a controlled overlap length 1050, preferably 1-150 nm, and at the same time overlaps other nanotube elements in other storage cells by approximately the same controlled overlap length 1050. Thus conductive element 1055' interconnects a plurality of cells, and the element is used during ERASE, PROGRAM, and/or READ operations explained in detail above. Nonvolatile storage cells 1390A and 1390B containing one select transistor and one nonvolatile two terminal switch layouts are mirror images of each other. Additional preferred methods of completing fabrication and passivation of the NRAM function (not shown) use well known semiconductor fabrication techniques.

Memory cells 1390A and 1390B (FIGS. 3 and 4), corresponding to nonvolatile 2-TNS 10 shown in FIGS. 1 and 2 are illustrated in memory array cross section 1395.

An electrical stimulus circuit 1, connected to one or both of the first and second terminals 20, 30, applies appropriate electrical stimulus to which the nanotube article 50 responds by changing the state of the switch as described herein. More specifically, nanotube element 50 responds to the stimulation by changing the resistance of switch 10 between the conductive elements 20 and 30; the relative value of the resistance corresponds to the state of the switch. For example, if stimulus circuit 1 applies a relatively high voltage and relatively high current across first and second terminals 20, 30, then nanotube article 50 responds by changing the resistance of the switch between first and second terminals 20, 30 to a relatively high resistance. This corresponds to an "erased" state of the device, where electrical conduction is relatively poor between first and second terminals 20, 30. For example, if stimulus circuit 1 applies a relatively low voltage and relatively low current across conductive elements 20 and 30, then nanotube element 50 responds by changing the resistance of the switch between conductive elements 20 and 30 to a relatively low resistance. This corresponds to a "programmed" state of the device, where electrical conduction is relatively good, or even near-ohmic, between conductive elements 20 and 30. Generally it is preferable that the values of the high and low resistances are separated by at least an order of magnitude. Example voltages, currents, and resistances for "programmed" and "erased" switch states for some embodiments of two-terminal nanotube switches are described in greater detail below.

First and second terminals 20, 30 are preferably made of a conductive material, and can be made of the same or different materials depending on the desired performance characteristics of switch 10. First and second terminals 20, can, for example, be composed of metals such as Ru, Ti, Cr, Al, Au, Pd, Ni, W, Cu, Mo, Ag, In, Ir, Pb, Sn, as well as other suitable metals, and combinations of these. Metal alloys such as TiAu, TiCu, TiPd, PbIn, and TiW, other suitable conductors, including CNTs themselves (single walled, multiwalled, and/or double walled, for example), or conductive nitrides, oxides, or silicides such as RuN, RuO, TiN, TaN, $CoSi_x$ and $TiSi_x$ may be used. Other kinds of conductor, or semiconductor, materials can also be used. First and second terminals 20, 30 generally have a thickness in the range of 5 to 500 nm, for example.

Preferred methods of fabricating a full overlap between a nanotube article 50 and first or second terminals 20, 30 follow well known techniques described in patent publications and issued patents incorporated by reference herein, or are currently used in present-day electronic industry practices.

Insulating layer 74 may be composed of $SiO_2$, SiN, $Al_2O_3$, BeO, polyimide, or other suitable insulating material, and have a thickness in the range of about 700 to about 1000 nm, for example. Insulating layer 74 is supported by substrate 60, made from silicon, for example. Substrate 60 may also be a composite of semiconductors, insulators, and/or metals that connect to first and second terminals 20, 30 to supply electrical signals to nonvolatile 2-terminal nanotube switch (2-TNS) 10 as described further below. In some embodiments, substrate 60 may be of the same material as insulating layer 60, e.g. quartz. In general, the insulating layer 74 may be any material that will accept the deposition of nanotubes by spin coating, but preferably a material chosen from the group consisting of a thermal oxide or nitride, including but not limited to silicon dioxide, silicon nitride, alumina on silicon, or any combination of the following on silicon or silicon dioxide: aluminum, molybdenum, iron, titanium, platinum, and aluminum oxide, or any other substrate useful in the semiconductor industry.

In some embodiments, nanotube article 50 is a fabric of matted carbon nanotubes (also referred to as a nanofabric). Methods of making nanotube elements and nanofabrics are known and are described in the incorporated patent references. In some embodiments, the nanotube element or fabric is porous, and material from first and second terminals 20, 30 fills at least some of the pores in the nanotube article 50. In some embodiments, nanotube article 50 includes single-walled nanotubes (SWNTs) and/or multi-walled nanotubes (MWNTs). In some preferred embodiments, the nanotube article 50 includes double walled nanotubes (DWNT). In some preferred embodiments, nanotube article 50 includes one or more bundles of nanotubes. In some preferred embodiments, nanotube article 50 includes one or more bundles of DWNTs. In some embodiments, nanotube article 50 includes SWNTs, MWNTs, nanotube bundles, and a large proportion of DWNTs. In some embodiments, nanotube article 50 includes a single nanotube.

Some nanotubes fabricated by some methods are preferred for use in 2-TNS 10. For example, nanotubes produced by CVD processes are preferred, e.g., they tend to consistently exhibit the switching behavior described herein.

In some embodiments, nanotube article 50 is a SWNT nanofabric with a thickness between 0.5 to 5 nm. In other embodiments nanotube article 50 is a MWNT nanofabric with a thickness between 5 to 20 nm. SWNT diameters may be in the range of 0.5 to 1.5 nm, for example. Individual nanotubes may have a length in the 0.3 to 4 um range, and thus can be long enough to span the separation between first and second terminals 20, 30. Nanotubes may also be shorter than the distance between first and second terminals 20, 30 but contact (or "network with") other nanotubes to span the separation between the elements. See U.S. Pat. No. 6,706,402, entitled "Nanotube Films and Articles" for details of conductive articles and networks formed from nanotubes. In general, the nanotube density should be high enough to ensure that at least one nanotube or network of nanotubes spans the entire distance between first and second terminals 20, 30. Other preferred characteristics for nanotubes are described herein.

The two-terminal nanotube switch 10 has a pathway between first and second terminals 20, 30 that can be in one of two states. One state is characterized by a pathway that has a relatively higher resistance, $R_{HIGH}$ between first and second terminals 20, 30. Current generally flows poorly between first and second terminals 20, 30 in this "open," "erased", or OFF state. The other state is characterized by a pathway that has a relatively low resistance, $R_{LOW}$ between first and second terminals 20, 30. Current generally flows easily between first and second terminals 20, 30 in this "closed," "programmed," or ON state.

Switch 10 is typically fabricated in the low-resistance state. The resistance of this state depends on the characteristics of nanotube article 50 and of first and second terminals 20, 30. The inherent resistance of nanotube article 50, and nanofabrics in general, can be controlled to be in the range of 100 to 100,000 ohms per square, for example, as measured by four-point probe measurements. Films with resistances between 1,000 to 10,000 ohms per square typically have a density of 250 to 500 nanotubes per square micron. In some embodiments nanotube article 50 preferably has, for example, between 1 and 30 nanotubes. In some embodiments nanotube element preferably has 5 to 20 nanotubes.

The total resistance of switch 10 between first and second terminals 20, in the "closed" state includes the contact resistance of each overlap region in series, plus the inherent series resistance of the nanotube, divided by the number of nanotube pathways (which may be single nanotubes and/or networks of nanotubes) between first and second terminals 20, 30. In some preferred embodiments, the total as-fabricated resistance of 2-TNS 10 is typically in the range of 101 k$\Omega$ to 40 k$\Omega$. In other preferred embodiments, the switch can be designed such that the resistance is less than 100$\Omega$ or greater than 100 k$\Omega$. An explanation of nanotube resistance may be found in the reference N. Srivastava and K. Banerjee, "A Comparative Scaling Analysis of Metallic and Carbon Nanotube Interconnections for Nanometer Scale VLSI Technologies", Proceedings of the 21.sup.st International VLSI Multilevel Interconnect Conference (VMIC), Sep. 29-Oct. 2, 1004, Wikoloa, Hi., pp. 393-398.

In general, the device performance does not vary strongly with the density of nanotubes in the nanotube element. For example, the sheet resistance of the nanofabric can vary by a factor of at least 10, and the device performs equally well. In a preferred embodiment, the sheet resistance of the nanofabric is below approximately 1 k$\Omega$. In some embodiments, the resistance of the nanofabric is assessed after fabrication, and if the resistance is found to be greater than approximately 1 k$\Omega$, then additional nanofabric is deposited with a density sufficient to lower the resistance below about 1 k$\Omega$.

Stimulus circuit 1 applies appropriate electrical stimulation to at least one of first and second terminals 20, 30 to switch 2-TNS 10 between the low resistance and high resistance states. In general, the appropriate electrical stimulation to 2-TNS 10 depends on the particular embodiment of the switch. For example, in some embodiments, stimulus circuit 1 can change switch 10 to the high resistance "open" state by applying a relatively high voltage bias across first and second terminals 20, 30 with unrestricted current. In some embodiments, this voltage is about 8-10 V, or about 5-8 V, or 3-5 V, or less. Sometimes, the electrical stimulation is a voltage pulse, and sometimes a series of pulses is used to switch 2-TNS 10 to the "open" state, for example a series of one or more pulses between 1-5 V. The duration of one or more pulses may also be varied to switch 2-TNS 10 to the "open" state. It has been found in some embodiments that allowing a relatively high current e.g. greater than 50 $\mu$A to flow through the switch can enhance its ability to switch to the "open" state. In some embodiments, stimulus circuit 1 must apply a stimulation that exceeds a critical voltage and/or current in order to switch 2-TNS 10 to an "open" state. In general, any electrical stimulation that is sufficient to cause 2-TNS 10 to switch to a relatively high resistance state can be used. In some embodiments, the state is characterized by a resistance $R_{HIGH}$ on the order of 1 G$\Omega$ or more. In general, the state can also be considered to be characterized by a relatively high impedance. The circuit design and method of using stimulus circuit 1 are conventional and described, for example, in US 2008/0012047 published on Jan. 17, 2008.

In some embodiments, stimulus circuit 1 can change switch 10 to the low resistance "closed" state by applying a relatively voltage bias across first and second terminals 20, 30. In some embodiments, a voltage of about 3-5 V, or about 1-3 V, or less, switches 2-TNS to the low-resistance state. In some cases, the electrical stimulation required to switch 2-TNS 10 to a "closed" state depends in part on the electrical stimulation that was used to switch 2-TNS 10 to an "open" state. For example, if a relatively high voltage bias was used to "open" the switch, then a relatively high voltage bias may be needed to "close" the switch. For example, if an 8-10 V pulse is used to "open" the switch, then a 3-5 V pulse may be needed to "close" the switch. If 3-5 V pulse is used to "open" the switch, then a 1-2 V pulse may be needed to "close" the switch. In general, the stimulation used to "open" and "close" the switch can vary each time, although the "close" stimulation depends in part on the "open" stimulation. In other words, even though the switch is "opened" for example with an 8-10 V pulse, and then "closed" with a 3-5 V pulse, the switch can subsequently be "opened" again with a 3-5 V pulse and "closed" with a 1-2 V pulse. Greater voltages used to open the switch lead to greater voltages to close the switch. Although the examples listed here use "open" voltages that are higher than the "close" voltages, in some embodiments the "close" voltages may be higher than the "open" voltages. A distinction between close and open operations relies more on current control than on voltage amplitude. As an example: a 6V erase pulse without current restriction can be used to open the switch and subsequently, an 8V program pulse with a current cap of 1 $\mu$A can be used to close the switch.

Sometimes, the electrical stimulation is a voltage pulse, and sometimes a series of pulses is used to switch 2-TNS 10 to the "closed" state, for example a series of one or more pulses between about 1-5 V. The duration of one or more pulses may also be varied to cause 2-TNS 10 to switch to the "closed" state. In some embodiments, the same voltage level can be used to "close" and "open" the switch, but the waveforms of the two stimuli are different. For example, a series of pulses at a given voltage could be used to "open" the switch, and a single pulse at the same or a similar voltage could be used to "close" the switch. Or, for example, a long pulse at a given voltage could be used to "open" the switch, and a short pulse at the same or a similar voltage could be used to "close" the switch. Using these sorts of waveforms may simplify the design of 2-TNS 10 because multiple voltages may not need to be applied to the switch. In particular embodiments of the invention, this phenomenon occurs when currents are limited during program and unrestricted during erase.

It has also been found in some cases that limiting the current that flows through the switch can enhance its ability to switch to the "closed" state. For example, adding a 1 M$\Omega$ inline resistor between stimulus circuit 1 and one of first or second terminals 20, 30, to limit the current in the switch to less than 1000 nA, can enhance the ability of 2-TNS 10 to switch to the "closed" state by about 40%. Another example is active circuitry that would limit the current during the program cycle. In general, any electrical stimulation that is sufficient to cause 2-TNS 10 to switch to a relatively low-resistance state can be used. In some embodiments, the state is characterized by a resistance $R_{LOW}$ on the order of about 100 k$\Omega$ or less. In some preferred embodiments, the resistance of the relatively high resistance state is at least about 10 times higher than the resistance of the relatively low resistance state. In general, the state can also be considered to be characterized by a relatively low impedance. In some preferred embodiments, the impedance of the relatively high impedance state is at least about 10 times higher than the impedance of the relatively low impedance state.

The two states are nonvolatile, i.e. they do not change until stimulus circuit 1 applies another appropriate electrical stimulus to at least one of first and second terminals 20, 30, and they retain state even if power is removed from the circuit. Stimulus circuit 1 can also determine the state of 2-TNS 10 with a non-destructive read-out operation (NDRO). For example, stimulus circuit 1 applies a low measurement voltage across first and second terminals 20, 30, and measures the resistance, R between the conductive elements. This resistance can be measured by measuring the current flow between first and second terminals 20, 30 and from that calculating the resistance R. The stimulus is sufficiently weak that it does not change the state of the device, for example is a voltage bias of about 1-2 V in some embodiments. In general it is preferable that $R_{HIGH}$ is at least ten times greater than $R_{LOW}$ so that stimulus circuit 1 can more easily detect the state.

The mechanism by which switching of the nanotube article 50 occurs, including the changes that may occur in the nanotubes is described in US Published Application 2008/0012047 dated Jan. 17, 2008, that is incorporated by reference herein in its entirety Passivation layers can also be useful for isolating components of the 2-TNS, e.g., the nanotube element and/or conductive elements, from the environment. For example, water in the air, or that adheres to the nanotube element, can etch the element at high temperatures. If an "open" stimulation is applied to a bare 2-TNS, overheating in the nanotube element may occur at a high enough temperature that any water at the element may sufficiently damage the element so that it no longer conducts current well. This "opens" the 2-TNS, but the switch cannot be subsequently "closed" because the conductive pathway provided by the nanotube element is irreversibly damaged. If instead, the 2-TNS is passivated with a preferred passivation layer, then the switch may be isolated from damaging water and may be repeatedly "opened" and "closed." It is preferable that any water adhered to the 2-TNS is removed before deposition of the passivation layer; otherwise the layer will simply trap water next to the switch. It is also preferable that the passivation layer does not outgas water, and is not permeable by water. It is also preferable that the passivation layer is not fabricated using a high power plasma, which can damage the nanotube element. Passivation layers may be made from any appropriate material known in the CMOS industry, including, but not limited to: PVDF (polyvinylidene pluoride), PSG (phosphosilicate glass) oxide, Orion oxide, LTO (planarizing low temperature oxide) oxide, sputtered oxide or nitride, flowfill oxide, ALD (atomic layer deposition) oxides. CVD (chemical vapor deposition) nitride also these materials may be used in conjunction with each other, i.e., a PVDF layer or mixture of PVDF and other copolymers may be placed on top of CNTs and this complex may be capped with an ALD $Al_2O_3$ layer; however any non-oxygen containing high temp polymers could be used as passivation layers. In some preferred embodiments passivation materials such as PVDF may be mixed or formulated with other organic or dielectric materials as copolymers such as PC7 to generate specific passivation properties such as to impart extended lifetime and reliability.

Passivation of NRAM devices may be used to facilitate device operation in air, at room temperature, and as a protecting layer in conjunction with stacked material layers on top on the NRAM device. Operation of unpassivated NRAM devices are typically performed in an inert ambient, such as argon, nitrogen, or helium, or an elevated (greater than 125° C.) sample temperature to remove adsorbed water from the exposed nanotubes. Therefore, the requirements of a passivation film are typically twofold. First, the passivation should form an effective moisture barrier, preventing exposure of the nanotubes to water. Second, the passivation film should not interfere with the switching mechanism of the NRAM device.

One approach to passivation involves cavities, which have been fabricated around the NRAM devices to provide a sealed switching region. Cavities both around individual devices (device-level passivation) and around an entire die of 22 devices (die-level passivation) have been demonstrated. However, the process flow to fabricate is complicated, with at least 2 additional lithography steps, and at least 2 additional etching steps required.

Another approach to passivation involves depositing a suitable dielectric layer over the NRAM devices. An example of this approach is the use of spin-coated PVDF in direct contact with the NRAM devices. The PVDF is patterned into either die-level (over an entire die active region) or device-level patches (individual patches covering individual devices). Then a suitable secondary dielectric passivation film, such an alumina or silicon dioxide is used to seal off the PVDF and provide a passivation robust to NRAM operation. It is thought that NRAM operation thermally decomposes the overlying PVDF, hence a secondary passivation film is required to seal off the devices. Since the die level passivations are typically about 100 micron square patches, this local decomposition can lead to ruptures of the secondary passivation, exposure of NRAM devices to air, and their subsequent failure. To avoid such failures of the secondary passivation film, the die-level passivated devices are "burned-in" electrically by pulsing the devices typically with 500 ns pulses from 4V to 8V in 0.5V steps. This is thought to controllably decompose the PVDF and prevent a rupture of the overlying secondary passivation film. After the burn-in procedure the die-level passivated NRAM devices operate normally. Devices passivated with a device-level PVDF coating and a secondary passivation film do not require such a burn in procedure and may be operated in air at room temperature directly at operating voltages. With device-level passivation the PVDF is patterned in the exact shape of the CNT fabric, typically 0.5 microns wide and 1-2 microns long. It is thought that such small patches can decompose without stressing the secondary passivation film to failure. It is possible that for a given defect density in the secondary passivation, there are no defects on average over the smaller footprint of the device-level PVDF patches in comparison to the larger, die-level patches.

The stimulus circuit 1 is in electrical communication with at least one of the first and second terminals 20, 20. The stimulus circuit 1 is capable of applying a first electrical stimulus to at least one of the first and second terminals 20, 30 to change the resistance of the device as formed between the first and second terminals from a relatively lower first resistance ($R_{LOW}$) to a relatively higher second resistance ($R_{HIGH}$) as described herein. The stimulus circuit 1 is capable of applying a second electrical stimulus to at least one of the first and second terminals to change the resistance of the device as formed between the first and second terminals from the relatively higher second resistance ($R_{HIGH}$) to the relatively lower first resistance ($R_{LOW}$), wherein the relatively higher second resistance between the first and second terminals corresponds to an "OFF" state of the device, and wherein the relatively lower first resistance between the first and second terminals corresponds to an "ON" state of the device, and wherein the plurality of devices as formed have an initial "ON" state yield and an initial "OFF" state yield. In an exemplary embodiment, in an initial untreated or as-manufactured condition of an array of 2-TNS 10 switches, the initial "ON" state yield may be much higher than the "OFF" state yield, such as, for example, an initial "ON" state yield of about 98% and an initial "OFF" state yield of about 67%. Thus, it is desirable to improve the initial yield of the 2-TNS 10 devices, particularly the ""OFF" state yield of the devices.

Referring again to FIG. 4, method 200 may also include treating 260 the plurality of 2-TNS 10 devices to provide post-treated devices. More particularly, treating 260 may be used to provide post-treated devices that have a post-treated "ON" state yield and a post-treated "OFF" state yield that is different than the "ON" state yield and "OFF" state yield as formed. Even more particularly, treating 260 may be used to provide 2-TNS 10 devices where the post-treated "OFF" state yield is greater than the initial "OFF" state yield, including 2-TNS 10 devices having a post-treated "ON" state yield of about 98% and the post-treated "OFF" state yield of about 98%. This means that the "OFF" state yield may be improved by treating 260 so that the post-treated "OFF" state yield is about 46% greater than the initial "OFF" state yield.

Post-treated 2-TNS 10 devices have a higher resistance than initial as-manufactured devices, including higher values of $R_{HIGH}$ and $R_{LOW}$. According to various aspects of the subject disclosure, in order to improve bit yield of bits comprising 2-TNS 10 switches, the resistance of the at least one CNT, or more particularly the plurality of CNTs, in nanotube article 50 may be raised so that they may turn off before they become too conductive. Thus, treating 260 comprises changing the resistance of the post-treated 2-TNS 10 devices compared to the devices as formed. 2-TNS 10 devices having various ranges of resistance associated with $R_{LOW}$ and $R_{HIGH}$ may be used. In an exemplary embodiment, a portion of the post-treated devices comprising the good devices, or those that passed the yield tests, may have a threshold resistance value of the switching region at 1 V after treating of between about 1 to about 10 MΩ, and the resistance of the device switching region greater than or equal to the threshold resistance ($R_{HIGH}$) comprises the "OFF" state of the device, and the resistance of the device switching region less than the threshold resistance comprises the "ON" state of the device.

In some aspects, the resistance of CNTs may be raised by treating 260 without etching the CNTs. The resistance of the CNTS can be increased by exposing the 2-TNS 10 and associated CNTs comprising nanotube article 50 to various reactive materials, and more particularly to various reactive gases. In some aspects, pressure pulses of xenon difluoride ($XeF_2$) may be used to increase the resistance of the CNTs. In one exemplary embodiment, a wafer containing an array of 2-TNS 10 switches with exposed nanotube articles 50 having an "ON" yield of about 98% and an "OFF" yield of about 67% may be treated in a vacuum treatment chamber with up to about five pressure pulses of $XeF_2$ of about 1 to about 10 Torr per pulse. After exposure to the reactive gas, the "ON" yield may remain at about 98% while the "OFF" yield may increase to about 98%. This increase in the off yield may be due to increased resistance (either through damage or fluorination). The higher resistance may allow the bits to have more time to turn off before they change to a low resistance state, or the higher resistance may allow the bits to heat up more quickly during programming so that they may break. In some aspects, the bits may be easier to break due to either defects caused by the reactive material or changes in bonding as a result of the fluoride-carbon (F—C) bonds. In some aspects, most CNTs may break to allow the 2-TNS 10 switch to operate correctly.

One approach uses more current to switch bits. However, a CMOS array under this approach may not be capable of delivering the current needed. According to various aspects of the subject disclosure, the subject technology does not involve any changes to the CMOS array and may operate under current capabilities of the CMOS array.

According to various aspects of the subject disclosure, various treating 260 techniques may be used to expose the nanotube article 50 for improved switching. These techniques may include various plasma treatment methods, including various plasma etching methods, and more particularly may include reactive ion etching, using various reactive materials, including various reactive gases, and more particularly including various halogens or compounds that include halogens, including fluorine, chlorine, bromine, or iodine, or combinations thereof, for producing increased resistance values. For example, suitable reactive gases may include carbon hydro-trifluoride, carbon tetrafluoride, nitrogen trifluoride, sulfur hexafluoride, boron trifluoride, hydrogen bromide or octofluorocyclobutane, or a combination thereof. The exposure may include a flow of the halogen gas that includes a flow rate of about 45 sccm, a pressure of about 100 mTorr, an etching power of about 0 to about 100 watts for a duration of about 30 to about 120 seconds. For the $CHF_3$ exposure, resistance may be increased to between about 45-100% after exposure with small length structures (more representative of NRAM) at about 50%. In some aspects, for the $CHF_3$, polymer may also be deposited at these powers, which may also be beneficial in passivating memory.

In some aspects, both the $CF_4$ exposures may increase resistance of about 70-160 percent. This increase may be dependent on the length of the CNT fabric. Annealing these wafers in rapid thermal processing (RTP) (e.g., at about 600 degrees Celsius for about one minute) may decrease the resistance to about the initial resistance value. The CF4 exposures may also be beneficial for memory cube structures where considerable increase in resistance may be realized at higher powers with minimal to no carbon loss on multilayered CNT fabrics (e.g., interconnects). In one example, at about 70 watts, blanket sheet resistance may increase from about 300 ohm/sq to about 450 ohm/sq after about 30 seconds, and up to about 1000 ohm/sq after a total of about 120 seconds.

According to various aspects of the subject disclosure, blanket exposures may also be utilized. Some of these exposures may produce an increase in resistance above a compliance limit without recovery after annealing. CNTs may be present in top down scanning electron microscopes (SEMs). In some aspects, blanket exposures may reduce pressure and power to about 35 mTorr and 25 W respectively. Additionally, the anneal temperature may be at about 400 degrees Celsius. In some aspects, sulfur hexafluoride ($SF_6$), octofluorocyclobutane ($C_4F_8$) may be utilized with blanket exposures. The CNTs (which may not crack at these powers) may show complete recovery after annealing. In some aspects, a nitrogen trifluoride ($NF_3$) exposure may also be utilized for treating CNT fabric for improved switching.

In various aspects of the subject disclosure, the subject technology may be used in various markets, including for example and without limitation, advanced sensors markets and memory/data storage markets.

The description of the invention is provided to enable any person skilled in the art to practice the various embodiments described herein. While the present invention has been particularly described with reference to the various figures and embodiments, it should be understood that these are for illustration purposes only and should not be taken as limiting the scope of the invention.

There may be many other ways to implement the invention. Various functions and elements described herein may be partitioned differently from those shown without departing from the spirit and scope of the invention. Various modifications to these embodiments will be readily apparent to those skilled in the art, and generic principles defined herein may be applied to other embodiments. Thus, many changes and modifications may be made to the invention, by one having ordinary skill in the art, without departing from the spirit and scope of the invention.

A reference to an element in the singular is not intended to mean "one and only one" unless specifically stated, but rather "one or more." The term "some" refers to one or more. Underlined and/or italicized headings and subheadings are used for convenience only, do not limit the invention, and are not referred to in connection with the interpretation of the description of the invention. All structural and functional equivalents to the elements of the various embodiments described throughout this disclosure that are known or later come to be known to those of ordinary skill in the art are expressly incorporated herein by reference and intended to be encompassed by the invention. Moreover, nothing disclosed herein is intended to be dedicated to the public regardless of whether such disclosure is explicitly recited in the above description.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description.

Having thus described the invention, it is claimed:

1. A two terminal switching device, comprising:
 a first conductive terminal; a second conductive terminal in spaced relation to the first terminal; the first terminal encompassed by the second terminal;
 an electrically insulating spacer, the spacer encompassing the first terminal and providing the spaced relation between the second terminal and the first terminal;
 a nanotube article comprising at least one carbon nanotube, the nanotube article being arranged to overlap at least a portion of each of the first and second terminals; and
 a stimulus circuit in electrical communication with at least one of the first and second terminals,
 the stimulus circuit capable of applying a first electrical stimulus to at least one of the first and second terminals to change the resistance of the device as formed between the first and second terminals from a relatively lower first resistance to a relatively higher second resistance,
 the stimulus circuit capable of applying a second electrical stimulus to at least one of the first and second terminals to change the resistance of the device as formed between the first and second terminals from the relatively higher second resistance to the relatively lower first resistance, wherein the relatively higher second resistance between the first and second terminals corresponds to an "OFF" state of the device, and wherein the relatively lower first resistance between the first and second terminals corresponds to an "ON" state of the device, and wherein the plurality of devices as formed have an initial "ON" state yield and an initial "OFF" state yield.

2. The device of claim 1, wherein the first and second states of the device are nonvolatile.

3. The device of claim 1, wherein the first terminal comprises a conductive via.

4. The device of claim 3, wherein the via is in electrical communication with a conductive substrate terminal.

5. The device of claim 4, wherein the substrate comprises a complementary metal oxide semiconductor device and the conductive substrate terminal comprises at least one terminal of at least one transistor.

6. The device of claim 1, wherein the second terminal comprises a conductive pathway disposed on an electrically insulating layer disposed on a surface of a substrate.

7. The device of claim 1, wherein the substrate comprises a complementary metal oxide semiconductor device, the insulating layer comprises an insulating layer deposited on the device, and the conductive pathway comprises a metallized pathway disposed on the insulating layer.

8. The device of claim 7, wherein the metallized pathway has an opening therein, and the first terminal is disposed within the opening.

9. The device of claim 8, wherein the electrically insulating spacer comprises a portion of the insulating layer that extends between the first terminal and the second terminal.

10. The device of claim 9, wherein the nanotubes article comprises a layer of a nanotube fabric comprising a plurality of the carbon nanotubes.

11. The device of claim 10, wherein the nanotubes fabric extends over the entire first terminal and provides a continuous overlap portion extending around a periphery of the opening.

12. The device of claim 11, wherein the overlap portion has a substantially uniform width.

13. The device of claim 10, wherein the nanotube fabric extends over a first continuous overlap portion extending around a periphery of the first terminal and a second continuous overlap portion extending around a periphery of the opening.

14. The device of claim 13, wherein the first overlap portion has a substantially uniform first width and the second overlap portion has a substantially uniform second width.

15. The device of claim 14, wherein the first overlap and the second overlap are each about 1 to about 150 nm.

16. The device of claim 10, wherein a portion of the nanotube fabric proximate the electrically insulating spacer comprises a switching region of the switching device.

17. The device of claim 16, wherein the switching region encompasses the first terminal.

18. The device of claim 16, wherein the switching region has a substantially uniform width.

19. The device of claim 18, wherein the width is between about 1 nm to about 200 nm.

20. The device of claim 16, wherein the switching region has a threshold resistance between about 1 M$\Omega$ to about 10 M$\Omega$ at 1 V, and a resistance of the switching region greater than or equal to the threshold resistance comprises the "OFF" state of the device, and a resistance of the switching region less than the threshold resistance comprises the "OFF" state of the device.

21. The device of claim 1, wherein the device further comprises a post-treated device having a post-treated resistance, wherein the first resistance and the second resistance of the post-treated device are greater than the first resistance and second resistance of the device as formed.

22. The device of claim 1, wherein each device further comprises a post-treated device having a post-treated "ON" state yield and a post-treated "OFF" state yield, and wherein the post-treated "OFF" state yield is greater than the initial "OFF" state yield.

23. The device of claim 22, wherein the post-treated "OFF" state yield is about 46% greater than the initial "OFF" state yield.

24. The device of claim 1, further comprising a passivation layer disposed on the nanotube article, first conductive terminal and second conductive terminal.

25. The memory array of claim 22, wherein the post-treated "ON" state yield is about 98% and the post-treated "OFF" state yield is about 98%.

26. A memory array, comprising:
a plurality of two-terminal switching devices disposed on a substrate, each device comprising:
a first conductive terminal; a second conductive terminal in spaced relation to the first terminal; the first terminal encompassed by the second terminal;
an electrically insulating spacer, the spacer encompassing the first terminal and providing the spaced relation between the second terminal and the first terminal;
a nanotube article comprising at least one carbon nanotube, the nanotube article being arranged to overlap at least a portion of each of the first and second terminals; and
a stimulus circuit in electrical communication with each of the at least one of the first and second terminals, the stimulus circuit capable of applying a first electrical stimulus to each of the at least one of the first and second terminals to change resistance of the device between the first and second terminals from a relatively lower first resistance to a relatively higher second resistance,
the stimulus circuit capable of applying a second electrical stimulus to each of the at least one of the first and second terminals to change the resistance of the device as formed between the first and second terminals from the relatively higher second resistance to the relatively lower first resistance, wherein the relatively higher second resistance between the first and second terminals corresponds to an "OFF" state of each of the devices, and wherein the relatively lower first resistance between the first and second terminals corresponds to an "ON" state of each of the devices, and wherein the plurality of devices as formed have an initial "ON" state yield and an initial "OFF" state yield.

27. The memory array of claim 26, wherein the first terminals comprise a plurality of conductive vias.

28. The memory array of claim 26, wherein the plurality of vias are in electrical communication with a corresponding plurality of conductive terminals of the substrate.

29. The memory array of claim 26, wherein the substrate comprises a complementary metal oxide semiconductor device and the plurality of conductive terminals comprise at least one terminal of at least a corresponding plurality of transistors.

30. The memory array of claim 26, wherein the second terminals comprise a plurality of spaced conductive pathways disposed on an electrically insulating layer disposed on a surface of the substrate.

31. The memory array of claim 30, wherein the substrate comprises a complementary metal oxide semiconductor (CMOS) device, the insulating layer comprises an insulating layer deposited on the CMOS device, and the plurality of spaced conductive pathways comprise spaced metallized pathways disposed on the insulating layer.

32. The memory array of claim 31, wherein each of the metallized pathways has a plurality of spaced openings therein, and the plurality of first terminals are disposed within corresponding openings.

33. The memory array of claim 32, wherein each of the electrically insulating spacers comprises a portion of the insulating layer.

34. The memory array of claim 33, wherein each of the nanotubes articles comprises a layer of a nanotube fabric comprising a plurality of the carbon nanotubes.

35. The memory array of claim 34, wherein each layer of the nanotube fabric extends over the entire corresponding first terminal and provides a corresponding continuous overlap portion extending around a corresponding periphery of the corresponding opening.

36. The memory array of claim 35, wherein each of the corresponding overlap portions has a substantially uniform width.

37. The memory array of claim 34, wherein each layer of the nanotube fabric extends over a corresponding first continuous overlap portion extending around a corresponding periphery of the corresponding first terminal and a corresponding second continuous overlap portion extends around a corresponding periphery of the corresponding opening.

38. The memory array of claim 37, wherein each corresponding first overlap portion has a corresponding substantially uniform first width and each corresponding second overlap portion has a corresponding substantially uniform second width.

39. The memory array of claim 38, wherein the first overlap and the second overlap are each about 1 to about 150 nm.

40. The memory array of claim 34, wherein a portion of each nanotube fabric proximate the corresponding electrically insulating spacer comprises a corresponding switching region of the corresponding switching device.

41. The memory array of claim 40, wherein each switching region encompasses the corresponding first terminal.

42. The memory array of claim 40, wherein each switching region has a corresponding substantially uniform width.

43. The memory array of claim 42, wherein each width is between about 1 nm to about 200 nm.

44. The memory array of claim 40, wherein each switching region has a threshold resistance between about 1 MΩ to about 10 MΩ at 1 V, and a resistance of the switching region greater than or equal to the threshold resistance comprises the "OFF" state of the device, and a resistance of the switching region less than the threshold resistance comprises the "OFF" state of the device.

45. The memory array of claim 26, wherein each device further comprises a post-treated device having a post-treated resistance, wherein the first resistance and the second resistance of the post-treated device are greater than the first resistance and second resistance of the device as formed.

46. The memory array of claim 26, wherein each device further comprises a post-treated device having a post-treated "ON" state yield and a post-treated "OFF" state yield, and wherein the post-treated "OFF" state yield is greater than the initial "OFF" state yield.

47. The memory array of claim 46, wherein the post-treated "OFF" state yield is about 46% greater than the initial "OFF" state yield.

48. The memory array of claim 26, further comprising a passivation layer disposed on the nanotube articles, first conductive terminals and second conductive terminals.

49. The memory array of claim 46, wherein the post-treated "ON" state yield is about 98% and the post-treated "OFF" state yield is about 98%.

50. A method of making a memory array, comprising:
forming a plurality of two-terminal switching devices disposed on a substrate, each device comprising:
a first conductive terminal;
a second conductive terminal in spaced relation to the first terminal; and
a nanotube article comprising at least one carbon nanotube, the nanotube article being arranged to overlap at least a portion of each of the first and second terminals; and
a stimulus circuit in electrical communication with each of the at least one of the first and second terminals, the stimulus circuit capable of applying a first electrical stimulus to each of the at least one of the first and second terminals to change a resistance of the device as formed between the first and second terminals from a relatively lower first resistance to a relatively higher second resistance, the stimulus circuit capable of applying a second electrical stimulus to each of the at least one of the first and second terminals to change the resistance of the device as formed between the first and second terminals from the relatively higher second resistance to the relatively lower first resistance, wherein the relatively higher second resistance between the first and second terminals corresponds to an "OFF" state of each of the devices, and wherein the relatively lower first resistance between the first and second terminals corresponds to an "ON" state of each of the devices, and wherein the plurality of devices as formed have an initial "ON" state yield and an initial "OFF" state yield.

51. The method of claim 50, further comprising: treating the plurality of devices to provide post-treated devices.

52. The method of claim 51, wherein treating comprises changing the resistance of the post-treated devices compared to the devices as formed.

53. The method of claim 51, wherein the post-treated devices have a post-treated "ON" state yield and a post-treated "OFF" state yield that is different than the "ON" state yield and "OFF" state yield as formed.

54. The method of claim 53, wherein the post-treated "OFF" state yield is greater than the initial "OFF" state yield.

55. The method of claim 53, wherein the post-treated "OFF" state yield is about 46% greater than the initial "OFF" state yield.

56. The method of claim 53, wherein the post-treated "ON" state yield is about 98% and the post-treated "OFF" state yield is about 98%.

57. The method of claim 51, wherein treating the devices comprises exposing the nanotube articles to a reactive gas.

58. The method of claim, 51, wherein treating the devices comprises exposure of the nanotube articles to a plasma.

59. The method of claim 52, wherein changing the resistance of the post-treated devices comprises increasing the resistance of the post-treated devices compared to the devices as-formed.

60. The method of claim 52, wherein each of the plurality of two-terminal switching devices further comprises an electrically insulating spacer, the spacer encompassing the corresponding first terminal and providing the spaced relation between the corresponding second terminal, and wherein each first terminal encompasses the corresponding second terminal, and wherein each of the nanotube articles comprises a nanotube fabric.

61. The method of claim 60, wherein treating comprises exposing the nanotube articles to a reactive gas.

62. The method of claim 61, wherein the reactive gas comprises $XeF_2$.

63. The method of claim 62, wherein exposing comprises providing the $XeF_2$ as a plurality of pressure pulses, each pressure pulse comprising raising the partial pressure of $XeF_2$ in contact with the nanotube articles.

64. The method of claim 63, wherein the plurality of pressure pulses comprises up to about five pressure pulses.

65. The method of claim 63, wherein the pressure pulses comprise a pressure of about 1 to about 10 Torr.

66. The method of claim, 60, wherein treating comprises reactive ion etching of the nanotube articles in a flow of a reactive gas.

67. The method of claim 66, wherein the reactive gas comprises a halogen.

68. The method of claim 67, wherein the halogen comprises fluorine, chlorine, bromine or iodine, or a combination thereof.

69. The method of claim 68, wherein the reactive gas comprises carbon hydro-trifluoride, carbon tetrafluoride, nitrogen trifluoride, sulfur hexafluoride, boron trifluoride, hydrogen bromide or octofluorcyclobutane, or a combination thereof.

70. The method of claim 66, wherein the flow of the halogen gas comprises a flow rate of about 45 sccm, a pressure of about 100 mTorr, an etching power of about 0 to about 100 watts for a duration of about 30 to about 120 seconds.

71. The method of claim 60, wherein changing the resistance of the devices comprises increasing the resistance of the devices.

72. The method of claim 70, wherein a portion of the post-treated devices has a threshold resistance value at 1 V after treating of between about 1 to about 10 MΩ, and the resistance of the device greater than or equal to the threshold resistance comprises the "OFF" state of the device, and the resistance of the devices switching region less than to the threshold resistance comprises the "ON" state of the device.

73. The method of claim 72, wherein the portion of the devices is at least about 98 percent.

* * * * *